(12) United States Patent
Kumar et al.

(10) Patent No.: US 12,614,586 B2
(45) Date of Patent: Apr. 28, 2026

(54) VARIATION TOLERANT RECONFIGURABLE REPLICA BITLINE CIRCUITS

(71) Applicant: Intel Corporation, Santa Clara, CA (US)

(72) Inventors: Naveen Kumar, Bangalore (IN); Gururaj Shamanna, Austin, TX (US); Jagadeesh Chandra Salaka, Bengaluru (IN); Purna Chandra Nayak, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 814 days.

(21) Appl. No.: 17/834,073

(22) Filed: Jun. 7, 2022

(65) Prior Publication Data

US 2023/0395140 A1 Dec. 7, 2023

(51) Int. Cl.
*G11C 11/419* (2006.01)

(52) U.S. Cl.
CPC .................................. *G11C 11/419* (2013.01)

(58) Field of Classification Search
CPC ........................................................ G11C 11/419
USPC .................................................... 365/189.16
See application file for complete search history.

(56) References Cited

U.S. PATENT DOCUMENTS

| | | | | |
|---|---|---|---|---|
| 10,916,327 B1 * | 2/2021 | He | ......................... | G11C 17/16 |
| 2010/0246309 A1 * | 9/2010 | Shimono | .................. | G11C 8/08 |
| | | | | 365/230.06 |
| 2011/0013468 A1 * | 1/2011 | Kawasumi | ............. | G11C 7/227 |
| | | | | 365/194 |

OTHER PUBLICATIONS

Amrutur et al., "A Replica Technique for Wordline and Sense Control in Low-Power SRAM's", IEEE Journal of Solid-State Circuits, vol. 33, No. 8, Aug. 1998, pp. 1208-1219.
Osada et al., "Universal-Vdd 0.65-2.0V 32kB Cache using Voltage-Adapted Timing-Generation Scheme and a Lithographical-Symmetric Cell", 2001 IEEE International Solid-State Circuits Conference, Session 11, SRAM, 11.1, Feb. 6, 2001, 3 pages.
Raychowdhury et al., "Tunable Replica Bits for Dynamic Variation Tolerance in 8T SRAM Arrays", IEEE Journal of Solid-State Circuits, vol. 46, No. 4, Apr. 2011, pp. 797-805.

* cited by examiner

*Primary Examiner* — Anthan Tran
(74) *Attorney, Agent, or Firm* — NICHOLSON DE VOS WEBSTER & ELLIOTT LLP

(57) ABSTRACT

An apparatus, system, and method for improved replica bit line (RBL) operation are provided. An memory control circuit can include an RBL including a plurality of replica bit cells (RBCs) electrically coupled in series, a timer and control logic circuit situated to receive an output of the RBL, and a first multiplexer electrically coupled between the RBL and the timer and control logic circuit, the first multiplexer configured to set a replica word line (RWL) that controls, based on a state of select lines input into the first multiplexer and input provided by the timer and control logic, which of the RBCs is active.

19 Claims, 8 Drawing Sheets

800

PROVIDE, BY AN RBL INCLUDING RBCS ELECTRICALLY COUPLED IN SERIES, AN OUTPUT TO A TIMER AND CONTROL LOGIC CIRCUIT    880

SET, BY A MULTIPLEXER, AN RWL THAT CONTROLS, BASED ON A STATE OF SELECT LINES INPUT INTO THE MULTIPLEXER AND INPUT PROVIDED BY THE TIMER AND CONTROL LOGIC, WHICH OF THE RBCS IS ACTIVE    882

VARIATION TOLERANT RECONFIGURABLE REPLICA BITLINE CIRCUITS

TECHNICAL FIELD

Embodiments pertain to memory access time and power improvements. Embodiments improve performance by using two replica bit line circuits, making the bit line circuit configurable (either static or dynamically configurable), or a combination thereof.

BACKGROUND

Static Random-Access Memory (SRAM) bit-cells are susceptible to manufacturing process variations. This is, at least in part, due to the SRAM bit-cells being formed using a smallest transistor allowed in manufacturing. In addition, SRAM bit-cells are sensitive to threshold voltage (Vt) shifts since SRAM read and write operations have a strong Vt dependence on both Positive Metal Oxide Semiconductor (PMOS) and Negative Metal Oxide Semiconductor (NMOS) transistors. Moreover, an embedded SRAM array can be required to operate over a wide temperature and voltage range, since modern Systems on Chip (SoCs) are optimized for both performance and power. To address these process and design challenges, memory providers provide options to tune or re-configure timing or pulse-width of critical signals in an SRAM controller after manufacturing.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Embodiments provide a re-configurable replica bit-line tracking circuit which provides the flexibility to re-configure pulse-width of a word line signal (e.g., on-the-fly) and also modulate timing of a sense amplifier enable signal in post-silicon. Embodiments can help improve power consumption, performance, and yield of SRAM. Some embodiments include multiple replica bit-lines. The multiple replica bit-lines reduce delay variation in a replica bit-line column.

Figure 1:
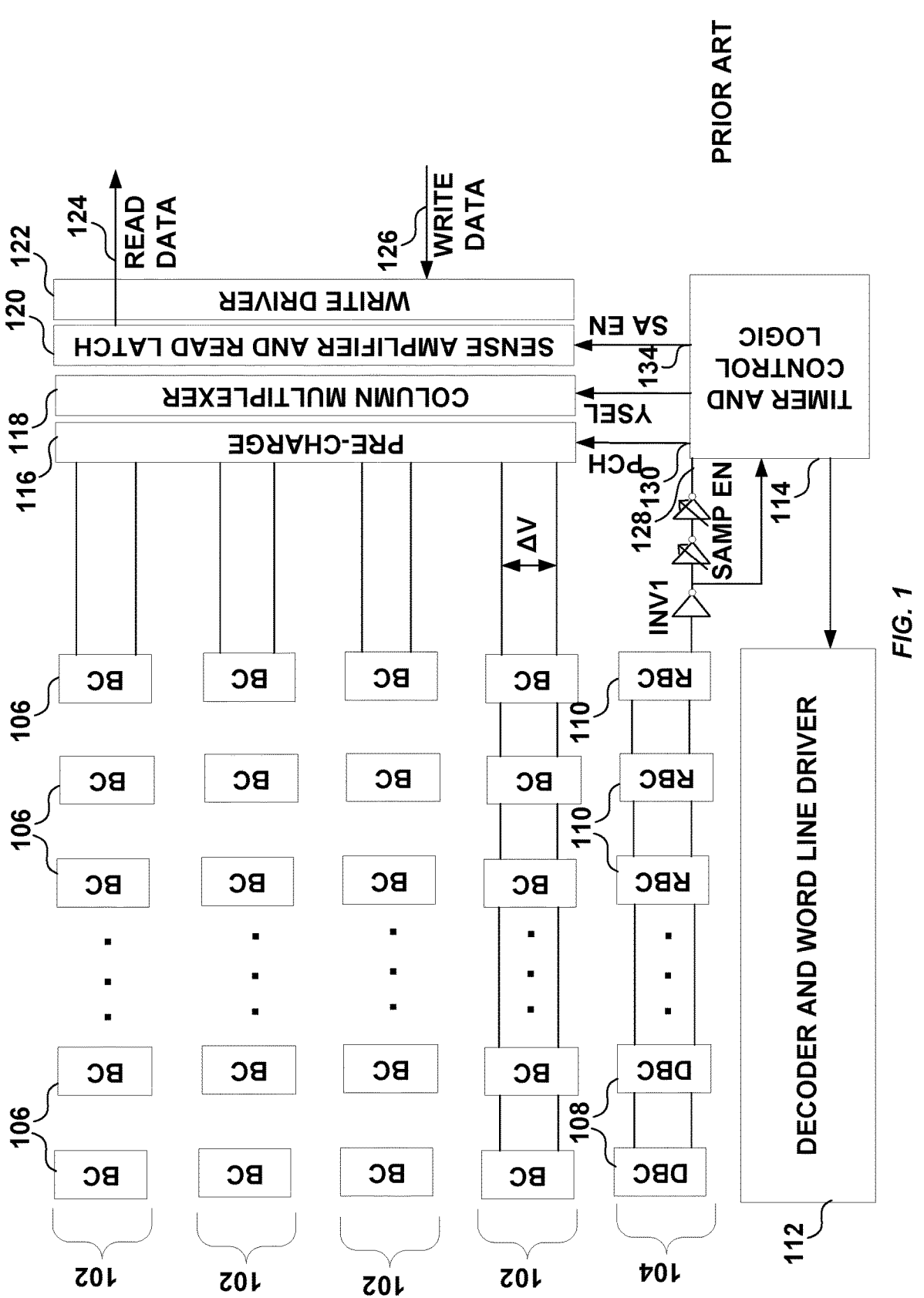
FIG. 1 illustrates, by way of example, a block diagram of an embodiment of a self-timed static random-access memory (SRAM) control circuit with a replica bit line (RBL).

FIG. 1 illustrates, by way of example, a block diagram of an embodiment of a self-timed SRAM control circuit with an RBL 104. Self-timed SRAM arrays can use the RBL 104 circuit to generate a sense-amp (SA) enable (EN) 134 and control pulse-width or high phase of word-line (WL) signal (shown elsewhere). The RBL scheme is preferred over inverter delay chain topology since the RBL topology is less sensitive to process variation, voltage variation, and temperature variation. In a typical RBL scheme, an extra column of bit-cells, the RBL 104, is inserted in the SRAM array. This additional column (sometimes referred to as an RBL column) includes cells of two bit-cell types: Dummy Bit-Cells (DBCs 108) that is electrically connected to VSS (logic '0') or ground (GND); and Replica Bit-Cell (RBC 110) that is electrically driven from Timing/Control logic circuit 114 instead of the driver 112.

During a read operation, multiple (~2 to 4) RBCs 110 are enabled (or activated) within the RBL 104. Multiple RBCs 110 are enabled to average (e.g., minimize) random local variation of RBCs 110. Enabled RBCs 110 discharge the pre-conditioned high ('1') RBL 104 to VSS. The RBL 104 is pre-conditioned using a pre-charge circuit 116. An inverter (INV1 in FIG. 1) can be used to sense RBL 104 state and generate a SA EN 134 signal. SA EN 134, when asserted, enables a sense amplifier and read latch circuit 120 electrically coupled to the bit-cell lines (BCL) 102. The sense amplifier and read latch circuit 120 samples a developed bit-line differential ($\Delta V$) and drives the sampled data to a downstream data-path. In addition to generating SA EN 134, the output of the INV1 can also be used to terminate a Word-Line (WL) signal from the driver 112. This implies that discharge delay of the RBL 104 also has an impact on pulse width of the WL signal. In summary, RBL 104 discharge delay determines SA EN 134 signal assertion time (for read operation) and WL signal pulse duration (for read and write operation).

The decoder and word line driver 112 includes circuitry that decodes a read or write address into BC rows and columns and drives the WL that selects the corresponding BC corresponding to the decoded address. The timer and control logic circuit 114 includes circuitry that controls the pre-charge circuit 116, a column multiplexer 118, and the sense amplifier and read latch circuit 120. The timer and control logic circuit 114 receives the sample enable 130 from the INV1, drives the pre-charge circuit 116 to charge a select BCL 102 that is selected by the column multiplexer 118 based on the decoded WL from the driver 112. After SAMP EN 128 is asserted, the sense amplifier and read latch circuit 120 is activated to sample and latch the data from the corresponding BCL 102. A write driver 122 operates to cause the BCs 106 to charge or discharge and store write data 126 at an address decoded by the driver 112.

A drawback of the RBL 104 approach of FIG. 1 is the inability to comprehend intra-die local random variation of BCs within the BCLs 102 and RBL 104. State of art solutions enable multiple replica bit-cells in a single RBL column to reduce impact of local random variation. For a given instance of the RBL 104, variation in the RBL 104 discharge delay reduces from about 7.5 picoseconds (pS) to 4 pS, when a number of active RBCs 110 is increased from 4 to 6.

However, at a slow power, voltage, and temperature (PVT) corner, the SA EN 134 may, to ensure correct read data 124, need to be asserted later than WL assertion than using the RBL 104 allows. The increased time requirement for a slow RBC 110 helps ensure adequate time for the BL ΔV to stabilize and the SA to sense data stored in BC 106 correctly.

Figure 2:
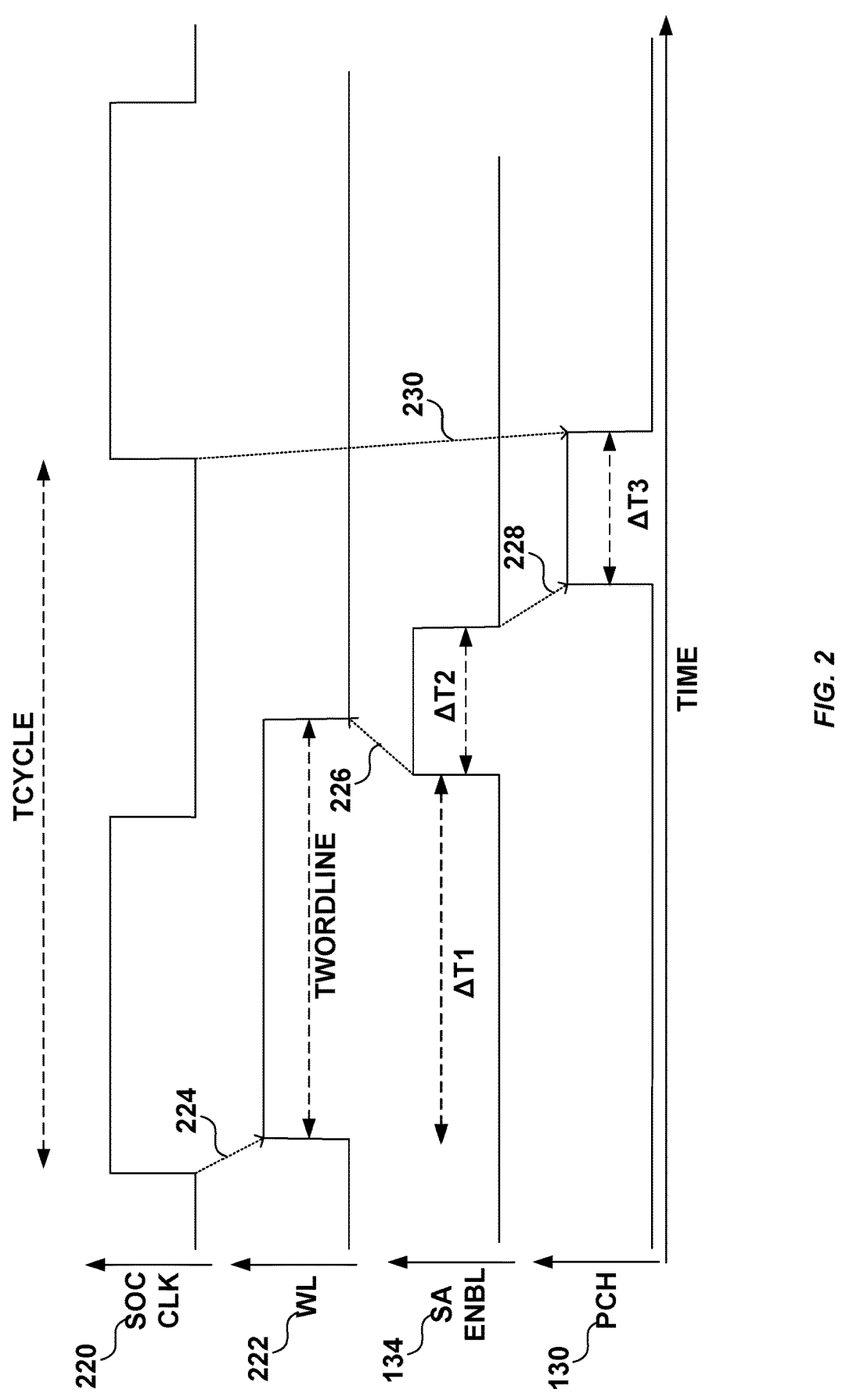
FIG. 2 illustrates, by way of example, a timing diagram of some select signals for SRAM operation.

FIG. 2 illustrates, by way of example, a timing diagram of some select signals for SRAM operation. The signals are illustrated in some time-synchronized voltage versus time plots. The signals includes a system on chip (SOC) clock (CLK) 220, WL 222, SA EN 134, and PCH 130. A rising edge of the SOC CLK 220 causes the WL 222 to be asserted as indicated by line 224. The WL 222 assertion triggers a discharge of the RBL 104. The discharge of the RBL 104 causes the SA EN 134 to be asserted, which in turn causes the WL 222 to de-assert as indicated by arrow 226. De-assertion of the SA EN 134 causes PCH 130 to be asserted as indicated by arrow 228. A next rising edge of the SOC CLK 220 causes the PCH 130 to de-assert as indicated by arrow 230. If the BC 106 is slow and the RBC 110 discharges too fast, ΔT1 will be too short to allow the correct ΔV to be sensed during a read operation. That is, SA EN 134 will be asserted too quickly for the correct ΔV to be sensed by the sense amplifier and latch circuit 120.

To help alleviate this problem, some solutions will add an inverter chain between the RBL 104 and the timing and control logic circuit 114. Such an inverter chain helps increase ΔT1. The inverter is not ideal since it does not track with ΔV development.

A bit-line (BL) discharge rate of a BCL 102 is based on a single BC 106 being activated. Due to random process variation, there is an equal probability for the activated BC to be either "slow" or "fast". If the activated BC 106 is "slow", the BL discharge rate in regular column will be slow and it will take more to develop the BL differential (ΔV). If the activated BC 106 in the BCL 102 is fast, a discharge rate of the BC 106 will be quicker and BL differential (ΔV) will be developed before SA EN 134 assertion. Since RBL 104 discharge rate is agnostic about BCL 102 discharge rate, a read failure can be realized in the case of a slow BC 106 and increased power consumption can be realized in the case of a fast BC 106.

To address the fast/slow BC 106 issue, some memory designers tune RBL 104 discharge time plus inverter chain delay time to account for a time at about a five-standard deviation (5σ) slow BC 106 in the BCL 102. Delay of this inverter chain can be modulated post-silicon using fuse control bits.

A slow BC 106 also has an impact on an SRAM write operation. A slow BC 106 in the context of a write operation translates to a wider WL 222 pulse width for data to be written into the BC 106. Memory designers tune the RBL 104 discharge delay assuming the ~5σ slow BC 106 for both read and write operations and discern the WL 222 pulse width accordingly. For example, a write-limited BC 106 can require a wider WL 222 pulse for a successful write as compared to a WL 222 pulse width requirement for read operation for that same BC 106. In such a scenario, RBL 104 time delay is tuned for write operation which in turn causes a delay in SA EN 134 assertion. A delayed SA EN 134 signal degrades read access time and increases read power. Read power increases since BLs are discharged more than the necessary threshold value, due to a wider WL 222 pulse.

Existing RBL 104 circuits with higher (>4 or 6) RBCs 110 enabled, reduce variation in RBL 104 discharge delay but require additional delay elements to sustain a WL 222 pulse width or separation between WL 222 and SA EN 134 signals, resulting in poor tracking across PVT corners. Existing RBL 104 circuits that use a single RBL 104 do not have ability to tune RBL 104 delay for optimal read access time since the same RBL 104 is also used for WL 222 and SA EN 134 assertion.

A circuit with multiple RBCs 110, and no additional control logic, provides a capability to optimize write access time but does not have the ability to optimize read access time based on material distribution since number of enabled RBCs 110 remains constant. Both single and multiple RBC 110 topologies cannot optimize read access power since WL 222 pulse width cannot be changed dynamically (e.g., based on type of memory operation (e.g., read or write)). A programmable inverter delay chain addresses some of the above-mentioned drawbacks but is not a robust solution since inverter delay correlates poorly with BL differential (LV) development.

Some embodiments include multiple RBLs 104. Multiple RBLs 104 reduce variation in an RBL 104 discharge delay across PVT corners and minimize (or even eliminate) use of an inverter delay chain in a self-timed tracking loop.

Some embodiments include a single RBL 104. The RBL 104 (whether part of an individual or multiple RBLs 104) can have a modulated delay. The modulated delay can be realized by re-configuring a number of RBCs 110 that are enabled (or activated). Re-configuration of RBCs 110 can be static (e.g., using fuse bits) or dynamic. Dynamic configuration can depend on the type of memory operation, such as to allow a first number of RBCs 110 to be used for a read operation and a second, different number of RBCs 110 to be used for a write access. Typically, fewer RBCs 110 can be used for a write operation as compared to a read operation. Yield risk can be reduced using embodiments and power/performance metrics can be improved using embodiments.

Figure 3:
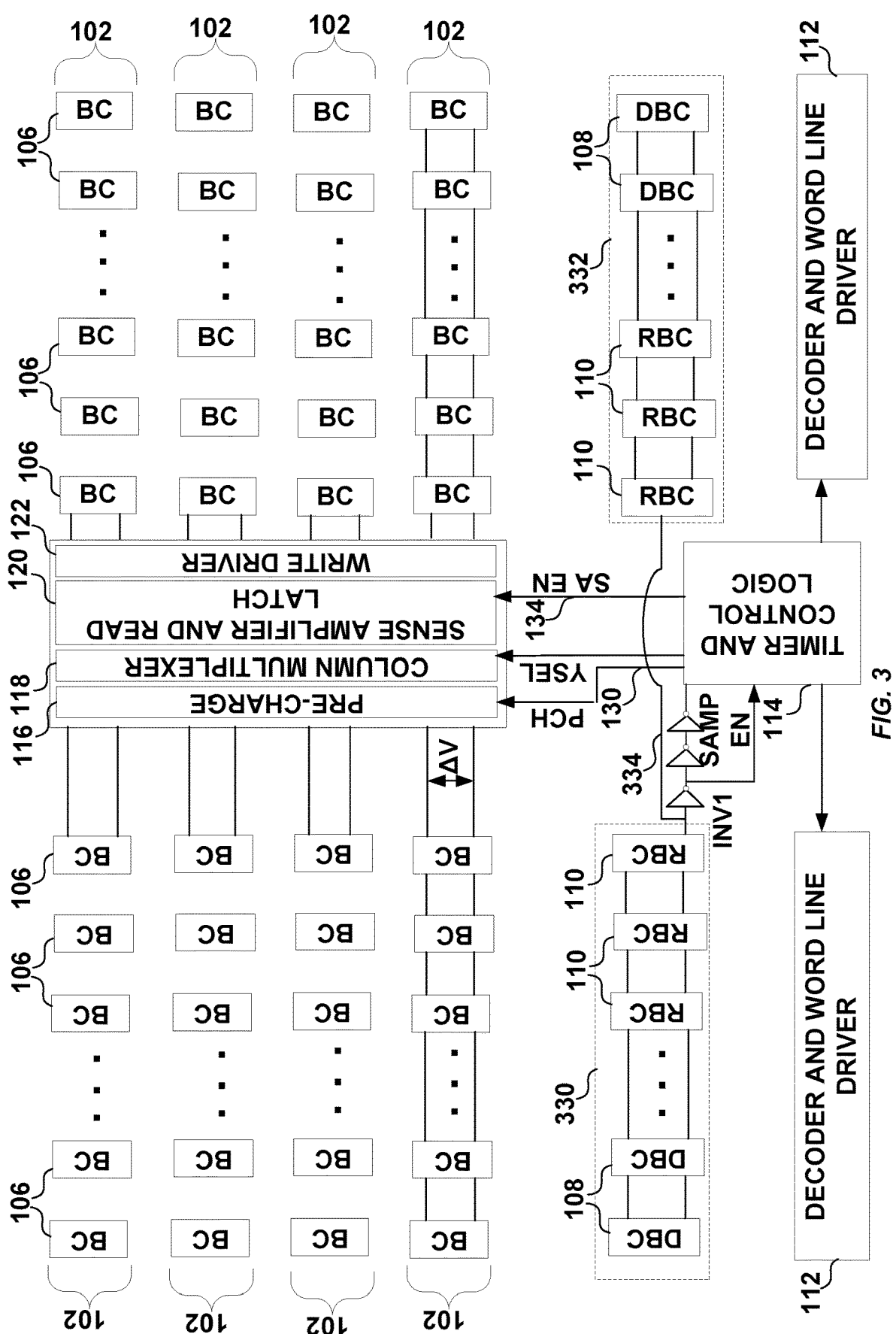
FIG. 3 illustrates, by way of example, a circuit diagram of an embodiment of SRAM circuitry that uses multiple RBLs.

FIG. 3 illustrates, by way of example, a circuit diagram of an embodiment of SRAM circuitry that uses multiple RBLs 330, 332. The multiple RBLs 330, 332 generate a delay between WL 222 and SA EN 134 signals. FIG. 3 shows one such variant in which two RBLs 330, 332 are used. Output of the RBLs 330, 332 are shorted by electrical line 334. Since two RBLs 330, 332 are used, an overall load of the RBL 330, 332 in the circuit increases by a factor of two, which in-turn forces the designer to activate (or enable) additional RBCs 110 to achieve a faster discharge rate. For example, since RBL 330, 332 load has increased by a factor of two in the example of FIG. 3 (due to usage of 2 RBL columns), a number of activated RBCs 110 can be doubled (e.g., from 2 to 4 or 4 to 8, etc.) so as to get similar discharge delay as a configuration with a single RBL 104. Enabling more RBCs 110 translates to lower variation (a) in RBC 110 delay due to an averaging effect realized by including more RBCs 110 in controlling SA EN 134.

Table 1 provides the mean (μ) and standard deviation (σ) of RBL 330, 332 discharge delay and self-time clock pulse width (stclk_pw) for an SRAM control circuit instantiation. It can be inferred from Table 1 that mean stclk_pw and RBL 330, 332 discharge delay is similar in both single RBL 104

(existing state of art) and multiple RBL 330, 332 implementations. However, there is about a 16% to about 30% reduction in standard deviation of self-timed clock (stclk) signal pulse width, is observed with a dual RBL 330, 332 scheme. This reduction in a translates to overall Tcycle improvement for the SRAM.

Incorporating a second RBL 332 translates to an about 1% increase in die area increase for a single bank SRAM array that is less than 16 KB. However, for a multi-bank SRAM array (as is illustrated in FIG. 3) the second RBL 332 adds zero area overhead. From a power perspective, the multiple RBL 330, 332 scheme increases read and write operation power consumption due to a load increase resulting from adding the RBL 332. This power increase can be offset by reducing a number of stages in an inverter chain post RBL 330, 332.

TABLE 1

STCLK_PW at a PVT corner

| 0.65 V −40° C. | Mean Single (pS) | Mean Double (pS) | St. Dev. Single (pS) | St. Dev. Double (pS) | Improvement at 3σ (pS) | σ ratio |
|---|---|---|---|---|---|---|
| 2 enabled RBCs per RBL | 783 | 774 | 30.6 | 21.8 | 26.4 | 0.71 |
| 4 enabled RBCs per RBL | 615 | 612 | 13.8 | 10.8 | 9.0 | 0.78 |
| 6 enabled RBCs per RBL | 556 | 555 | 9.6 | 8.1 | 4.5 | 0.84 |

TABLE 2

RBL 90% to 10% discharge delay

| 0.65 V −40° C. | Mean Single (pS) | Mean Double (pS) | St. Dev. Single (pS) | St. Dev. Double (pS) | Improvement at 30 (pS) | σ ratio |
|---|---|---|---|---|---|---|
| 2 enabled RBCs per RBL | 489 | 474 | 32.73 | 21.9 | 32.5 | 0.67 |
| 4 enabled RBCs per RBL | 268 | 261 | 11.1 | 7.6 | 10.5 | 0.68 |
| 6 enabled RBCs per RBL | 197 | 193 | 5.6 | 4.1 | 4.5 | 0.73 |

In summary, the multiple RBL technique enables:

An RBL discharge delay component to have a larger range of delays than an inverter chain delay component and thus the RBL discharge delay component tracks better across PVTs. For a fixed RBL scheme, the multiple RBL embodiments provide up to about 30% lower OCV (on-chip variation) of clock pulse width and minimum discharge delay period. For a multi-bank SRAM array, this multi-RBL circuit has no area/power overhead. These benefits can be realized in a high-speed SRAM circuit that has a large operating voltage range, enabling better tracking with PVTs and also reducing OCV penalty.

Existing RBL control circuits do not have the capability to change or alter discharge rate of replica bit-line circuit after manufacturing since the number of activated RBCs 110 is constant. Some embodiments provide a statically or dynamically reconfigurable RBL.

Figures 4, 5:
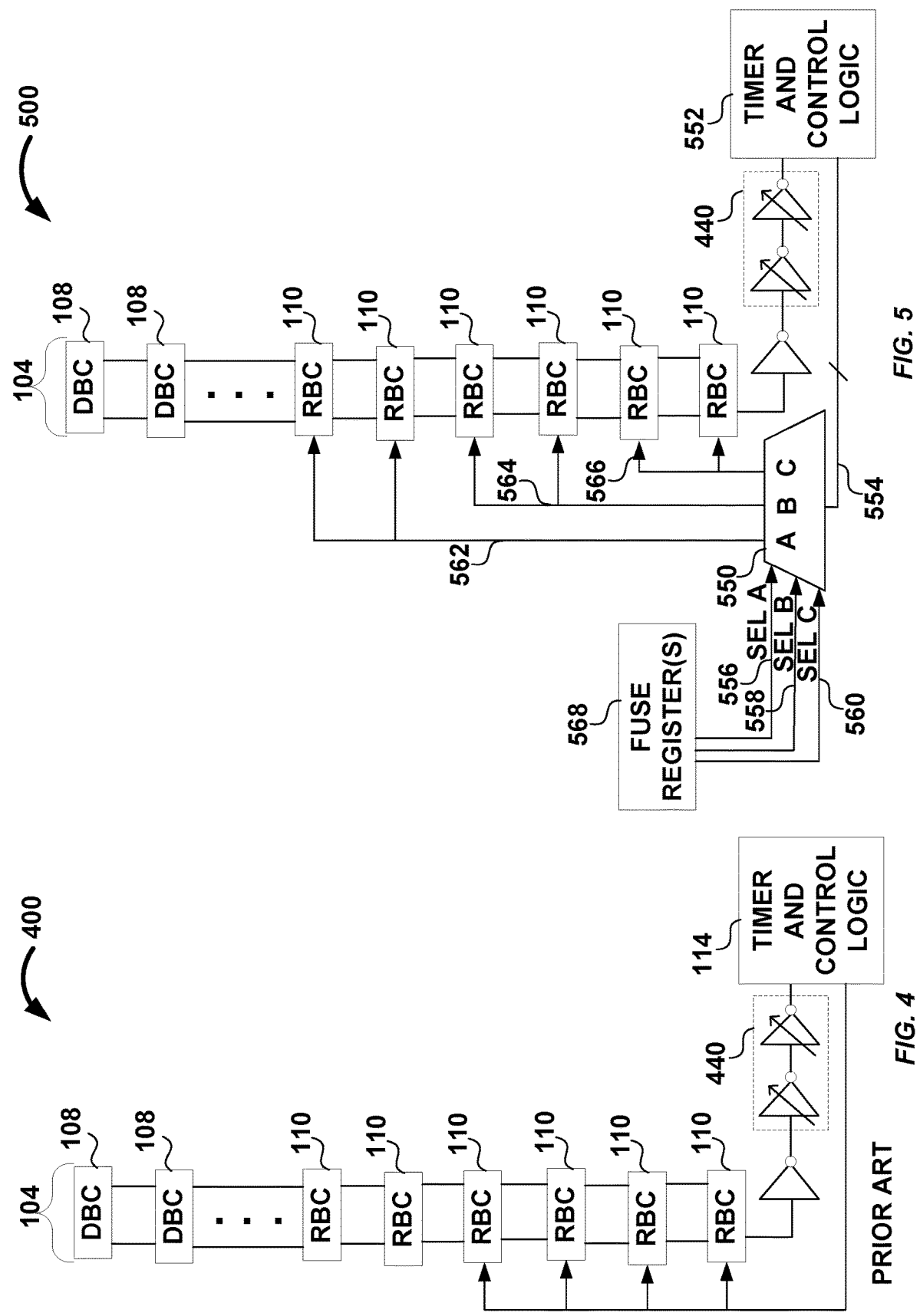
FIG. 4 illustrates, by way of example, a circuit diagram of a prior RBL control circuit configuration.
FIG. 5 illustrates, by way of example, a circuit diagram of an embodiment of an improved RBL control circuit.

FIG. 4 illustrates, by way of example, a circuit diagram of a prior RBL control circuit 400 configuration. The RBL control circuit 400 includes the RBL 104, a configurable inverter delay chain 440, and the timer and control logic circuit 114. The number of active RBCs 110 in the circuit 400 is fixed at manufacturing. Then, a designer adjusts a number of inverters in the inverter delay chain 440 that are in the electrical path between the output of the RBL 104 and the input of the timer and control logic circuit 114.

FIG. 5 illustrates, by way of example, a circuit diagram of an embodiment of an improved RBL control circuit 500. The circuit 500 includes a configurable number of active RBCs 110 and optionally includes the inverter delay chain 440. The timer and control logic circuit 552 in the circuit 500 is configured to control select lines 556, 558, 560 of a multiplexer (mux) 550. Each of the select lines 556, 558, 560, when asserted (or de-asserted if negative logic is used) causes the mux 550 to activate one or more of the RBCs 110. The select lines 556, 558, 560 can be controlled by the timer and control logic circuit 552 or by fuse bits that can be set after manufacturing. The number of active RBCs 110 is thus dynamically or statically controllable. The circuit 500 thus statically or dynamically controls how many of the RBCs 110 are active at a given time. If RBCs 110 of the RBL 104 are considered faster, then fewer RBCs 110 can be active for a given operation. If RBCs 110 of the RBL 104 are considered slower, then more RBCs 110 can be active for a given read or write operation. The select lines 556, 558, 560 can be set by a state of one or more fuse registers 568.

The timer and control logic circuit 552 can be configured to control the select lines 556, 558, 560, a multiplexer word 554, or a combination thereof. The multiplexer word 554 controls the output of the mux 550 when that output is selected by the select line 556, 558, 560.

The circuit 500 provides modulation of a number of activated RBCs 110. The number of activated RBCs 110 is varied by controlling replica WLs (RWLs) 562, 564, 566 using the mux 550. In the illustrated embodiment of FIG. 5 the activated RBC 110 count can vary from 2 to 6 (increments of 2), thereby modulating discharge rate of the RBL 104. The discharge rate of the RBL 104 is sped-up by activating more RBCs 110 by asserting their corresponding RWLs 562. The discharge rate of the RBL 104 can be slowed by activating fewer RBCs 110. Since mux select signals (SEL A 556, SEL B 558, and SEL C 560) can be static (e.g., fuse bits), configurability of the RBL 104 delay can be performed after manufacturing of the circuit 500. The RBL 104 delay configuration can be performed after manufacturing by exercising a built-in self-test (BIST) pattern on engineering wafer lots and choosing a fuse setting that results in lowest yield fallout across the sample material distribution.

This approach of re-configuring RBL 104 delay for yield can be extended to enhance performance by analyzing frequency readouts from process monitor data blocks (e.g., inter-die variation (IDV)). IDV frequency is typically used to classify wafers into Typical, Fast and Slow buckets. IDV frequency information can also be used to customize fuse setting (SEL A 556, SEL B 558, and SEL C 560) for RBL circuit 500. As an example, minimum (slow RBL 104 discharge) number of RBCs 110 are enabled for slow wafers whereas fast wafers will have maximum number of RBCs 110 enabled (fast RBL 104 discharge). This approach increases complexity of manufacturing flow but improves performance significantly. For example, read access time improves by about 3% to 5% (see Table 3) for typical and fast material, respectively, at 0.65V, by modulating a number of enabled RBCs 110. This method of re-configuring RBL 104 delay is considered "static", since enabled RBCs 110 count cannot be altered after fuse bits (SEL A 556, SEL B 558, and SEL C 560) are programmed.

TABLE 3

| Read Access Time Improvement by Re-Configuring RBL delay | | | | | |
|---|---|---|---|---|---|
| | | | | FIG. 5 | |
| | | Prior Art | | Embodiments | |
| 0.65 V –40° C. | | No. of | Read Access | No. of | Read Access | % Im- |
| Fre-quency | Material Type | RBCs Enabled | Time (pS) | RBCs Enabled | Time (pS) | prove-ment |
| 13.0 GHz | Typical | 4 | 762 | 6 | 740 | 3 |
| 14.0 GHz | Fast | 4 | 629 | 8 | 600 | 5 |
| 12.0 GHz | Slow | 4 | 980 | 4 | 980 | 0 |

Figure 6:
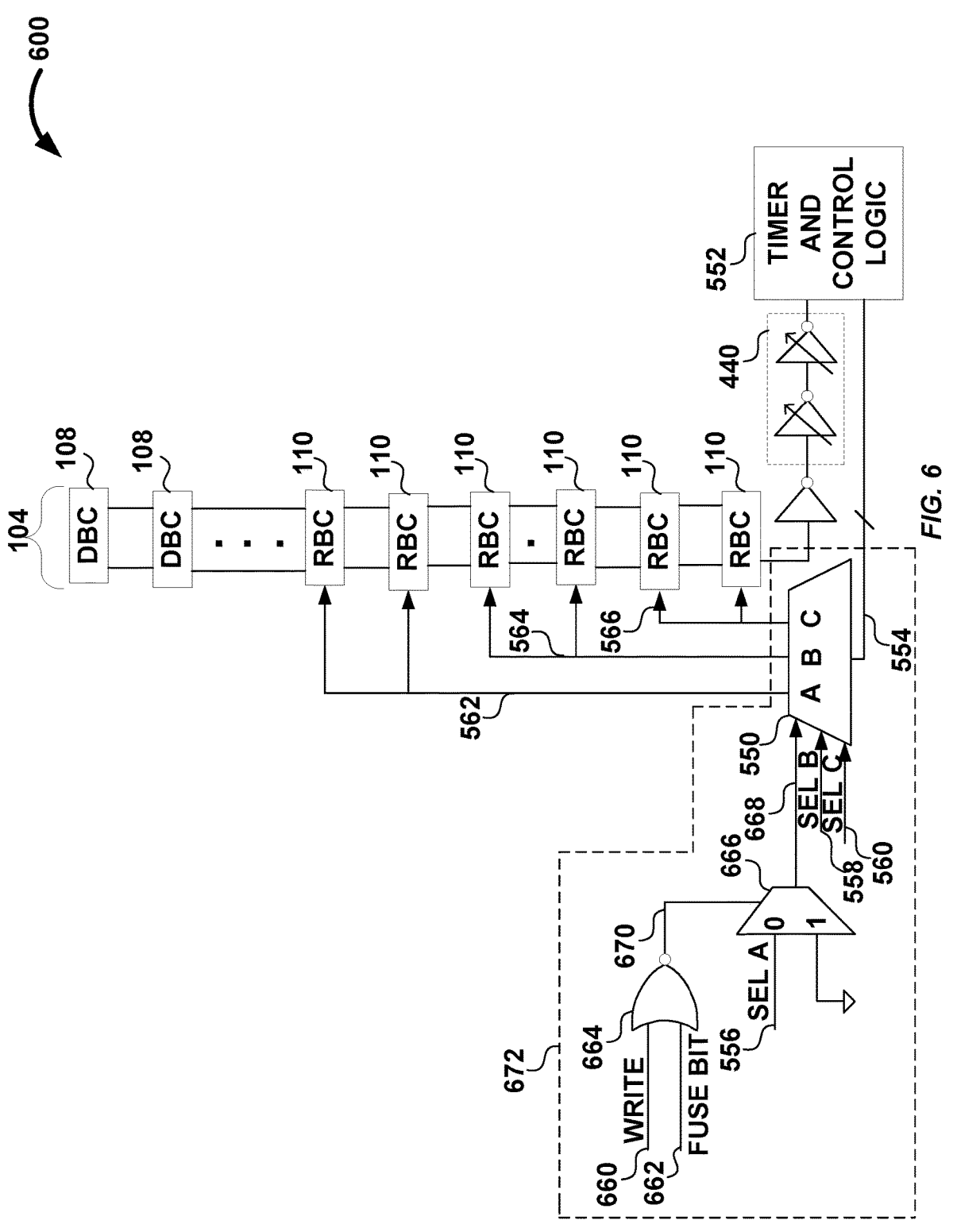
FIG. 6 illustrates, by way of example, a circuit diagram of a dynamically reconfigurable RBL circuit.

FIG. 6 illustrates, by way of example, a circuit diagram of a dynamically reconfigurable RBL circuit 600. The circuit 600 includes the circuit 500 with the select line 556 replaced with a multiplexer 666 output 668 and an additional logic gate component 664. The timer and control logic circuit 552 can control a write operation line 660. The write operation line 660 can be asserted, by the timer and control logic circuit 552, when a write operation is being performed on the SRAM (the BCs 106) and de-asserted otherwise. A fuse bit line 662 can be electrically coupled to a fuse register 568 (see FIG. 5). The fuse bit line 662, when asserted, prohibits dynamic reconfiguration of the RBL 104. The fuse bit line 662, when de-asserted, permits dynamic reconfiguration of the RBL 104. This is because the logic gate component 664 of FIG. 6 is illustrated as a NOR gate. Thus, when either or both of the write operation line 660 and the fuse bit line 662 are asserted, the output of the NOR gate is "0" and the select line 556 is selected. In any other configuration, the ground line (logic "0") is selected and the mux 666 outputs a ground signal (logic "0"). Using the circuit 600, when the fuse bit line 662 is asserted and any operation (read, write, or no operation) is occurring, the select line 556 is selected because a multiplexer control line 670 is de-asserted. The selection of the select line 556 activates or retains RBCs 110 coupled to RWL 562 active. This essentially increases the number of active RBCs 110 during a read operation and no operation reduces the number of active RBCs 110 during a write operation. Reducing the number of active RBCs 110 during a write operation provides a longer WL PW so as to provide more time for completion of write operation.

Dynamic reconfigurability of the RBL 104 using the circuit 600 can be realized by varying a number of activated RBCs 110. The number of active RBCs 110 can depend on a type of memory operation (e.g., read or write) being performed. A write-limited BC 106 can require a wider WL PW to write data into the BC 106 as compared to reading data from the BC 106. Since the WL signal is common for both read and write operations in SRAM arrays, a wider WL PW implies a slower discharge rate of the RBL 104, which implies a late arriving SA EN 134. As a result, SRAM read access time is de-graded. In addition, a wider WL PW increases dynamic power during a read operation since bit-lines develop more voltage differential than necessary if given too much time. Circuitry 672 provides the circuit 600 an ability to modulate (e.g., increase) RBL 104 delay for a memory write operation.

The mux 666 (illustrated as a 2:1 mux in FIG. 6) ensures that one of the select lines (e.g., SEL A 556 in FIG. 6) is connected to GND (sometimes called "VSS" or logic '0') in a write operation. This means that, for the circuit 600, a maximum of 4 RBCs 110 can be activated for a write operation and that 6 RBCs 110 can be activated in a read operation, thereby providing the capability to have different WL PWs for read & write operations. This is different from current RBL 104 control circuits which use a same number of active RBCs 110 for both read and write operations. It can be inferred from Table 4 that a re-configurable RBL 104 topology, like that of FIG. 6, improves access time by about 20% and reduces dynamic power in a read operation by about 15%.

TABLE 4

| Read Access Time and Power Improvement from Dynamically Reconfigurable RBL Topology | | | |
|---|---|---|---|
| 0.65 V –40° C. | Prior Art | FIG. 6 Embodiments | % Improvement |
| No. RBCs Enabled for Read | 2 | 4 | |
| Read Access Time (pS) | 1120 | 980 | 15 |
| WL PW for Read (pS) | 827 | 667 | |
| Read Access Power (pJ) | 0.36 | 0.3 | 20 |
| No. RBCs Enabled for Write | 2 | 2 | |
| Write Access Time (pS) | 605 | 605 | |
| WL PW for Write (pS) | 827 | 827 | |

The proposed re-configurable RBL schemes (static and dynamic) can optionally co-exist with the inverter delay chain 440 in some embodiments. It should be noted that FIGS. 5 and 6 are for illustration and a number of RBCs 110 in the RBL 104 can be more or less than six and a number of activated RBCs 110 for different fuse settings need not be in increments of 2 as illustrated in FIGS. 5 and 6. More or fewer RBCs 110 can be activated for different fuse settings.

Figure 7:
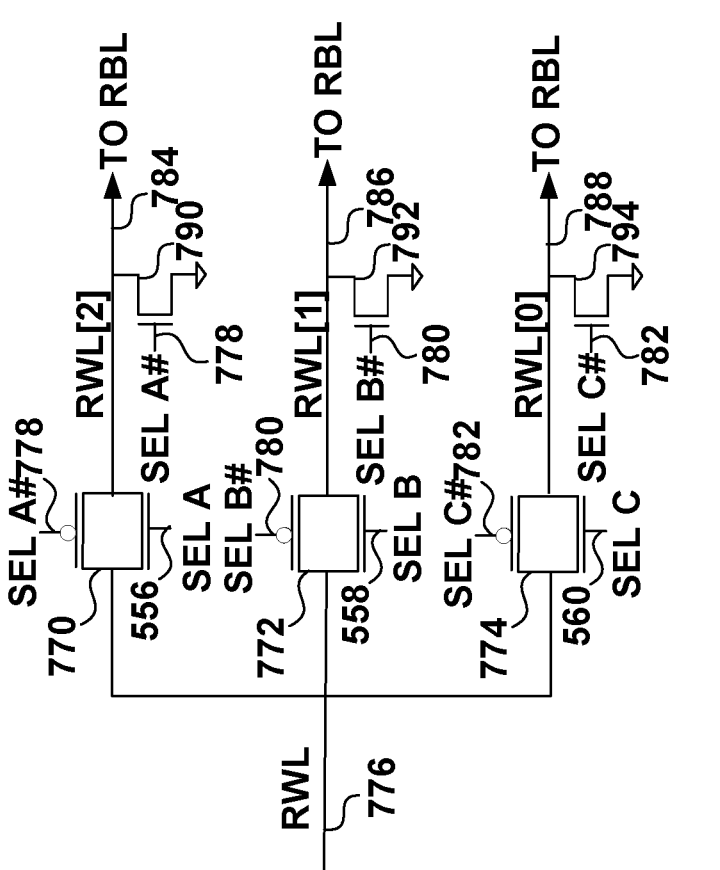
FIG. 7 illustrates, by way of example, a circuit diagram of an embodiment of the multiplexer illustrated in FIG. 5.

FIG. 7 illustrates, by way of example, a circuit diagram of an embodiment of the multiplexer 550. The multiplexer 550 includes transmission gates 770, 772, 774 (sometimes called pass gates) with complementary select lines as input. Complementary select lines include the select line 556, 558, 560 and a negated version of the select line 778, 780, 782, respectively. Each of the transmission gates 770, 772, 774 are situated electrically in parallel with each other and receive an RWL line 776 as input. The transmission gates 770, 772, 774 each produce a respective bit of an RWL that is transmitted on a respective RWL line 784, 786, 788. A transistor 790, 792, 794 electrically coupled in parallel to the RBL 104 can make the state of the respective RWL line 784, 786, 788 a logic "0" if a respective select line complement 778, 780, 782 is asserted. If the respective select line complement 778, 780, 782 (negate is indicated by "#" in FIG. 7) is de-asserted, the value of the RWL line 776 is passed on the RWL line 784, 786, 788.

Figure 8:
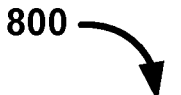
FIG. 8 illustrates, by way of example, a block diagram of an embodiment of a method for improved memory control circuit operation.
Figure 8:
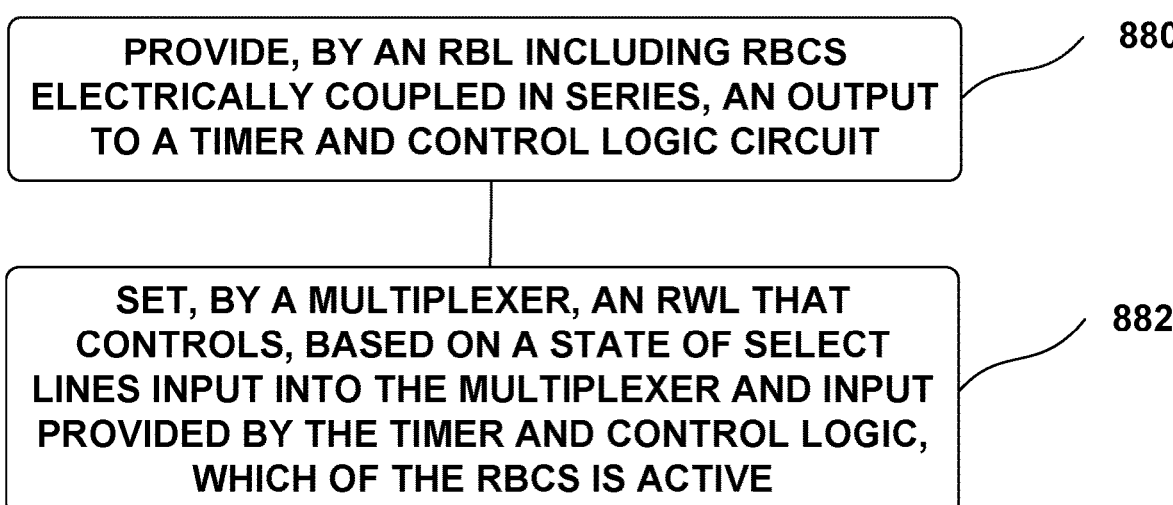

FIG. 8 illustrates, by way of example, a block diagram of an embodiment of a method 800 for improved memory control circuit operation. The method 800 as illustrated includes providing, by an RBL including RBCs electrically coupled in series, an output to a timer and control logic circuit, at operation 880; and setting, by a multiplexer, an RWL that control based on a state of select lines input into the multiplexer and input provided by the timer and control logic, which of the RBCs is active, at operation 882.

The method 800 can further include, wherein the state of the select lines is set based on a state of one or more fuse registers. The method 800 can further include, wherein the multiplexer includes, for each select bit of the multiplexer, a transmission gate configured to receive a select control bit and a bit of the RWL and provide an output RWL select bit based on the select control bit and the bit of the RWL. The method 800 further includes providing, by a transmission gate, the RWL as output if the select bit is asserted and output logic zero otherwise.

The method 800 can further include wherein the multiplexer is a first multiplexer. The method 800 can further include receiving a bit of the RWL, a logic 0, and a second select line different from the select lines as input at a second multiplexer. The method 800 can further include providing either the bit of the RWL or the logic 0 as output based on a state of the second select line. The method 800 can further include de-asserting, by the second multiplexer, the output if the timer and control logic circuit asserts a write operation line. The method 800 can further include receiving, at a logic gate component, the write operation line and output of a fuse register. The method 800 can further include outputting, by the logic gate component, the second select line based on a state of the write operation line and the output of the fuse register. The logic gate can be a NOR gate. The second multiplexer can be a 2:1 multiplexer. The method 800 can further include delaying, by a configurable inverter delay chain electrically coupled between the output of the RBL and the time and control logic circuit, output of the RBL.

Figure 9:
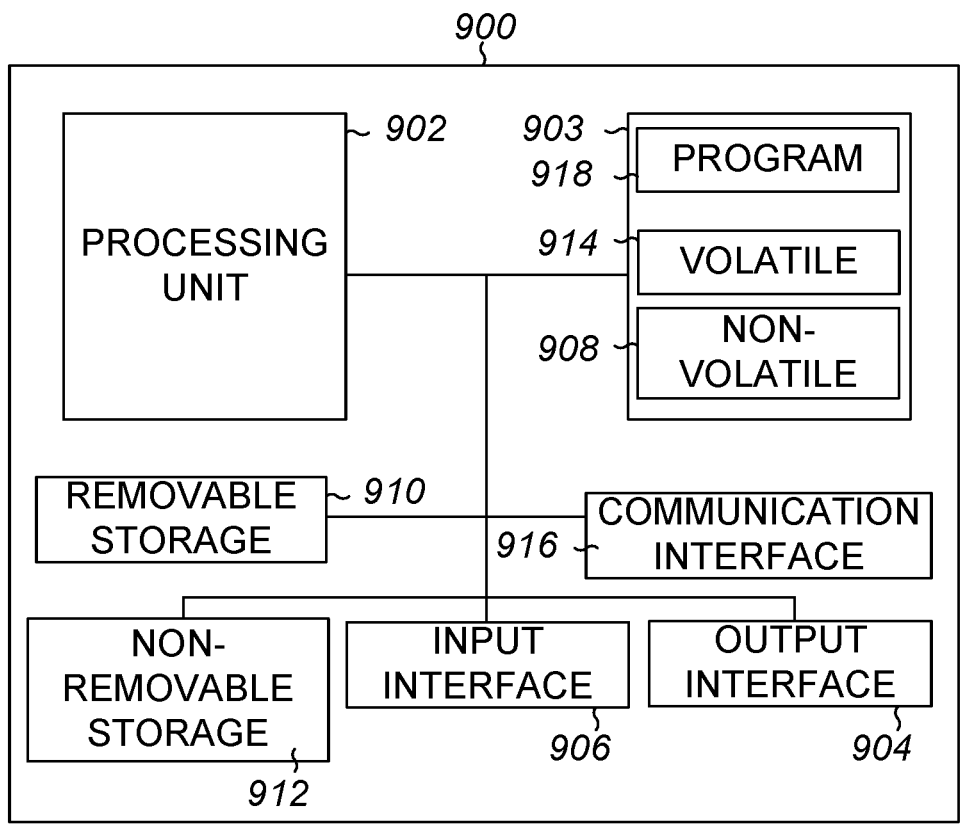
FIG. 9 illustrates, by way of example, a block diagram of an embodiment of a machine (e.g., a computer system) in which the improved memory control circuit of FIG. 3, 5, 6, 7, a combination thereof or another circuit discussed herein can be used.

FIG. 9 illustrates, by way of example, a block diagram of an embodiment of a machine 900 (e.g., a computer system) in which the improved memory control circuit of FIG. 3, 5, 6, 7, a combination thereof or another circuit discussed herein can be used. One example machine 900 (in the form of a computer), may include a processing unit 902, memory 903, removable storage 910, and non-removable storage 912. Although the example computing device is illustrated and described as machine 900, the computing device may be in different forms in different embodiments. Further, although the various data storage elements are illustrated as part of the machine 900, the storage may also or alternatively include cloud-based storage accessible via a network, such as the Internet.

Memory 903 may include volatile memory 914 and non-volatile memory 908. The machine 900 may include— or have access to a computing environment that includes—a variety of computer-readable media, such as volatile memory 914 and non-volatile memory 908, removable storage 910 and non-removable storage 912. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 900 may include or have access to a computing environment that includes input 906, output 904, and a communication connection 916. Output 904 may include a display device, such as a touchscreen, that also may serve as an input device. The input 906 may include one or more of a touchscreen, touchpad, mouse, keyboard, camera, one or more device-specific buttons, one or more sensors integrated within or coupled via wired or wireless data connections to the machine 900, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi), Bluetooth, or other networks.

Computer-readable instructions stored on a computer-readable storage device are executable by the processing unit 902 (sometimes called processing circuitry) of the machine 900. A hard drive, CD-ROM, and RAM are some examples of articles including a non-transitory computer-readable medium such as a storage device. For example, a computer program 918 may be used to cause processing unit 902 to perform one or more methods or algorithms described herein.

Note that the term "circuitry" or "circuit" as used herein refers to, is part of, or includes hardware components, such as transistors, resistors, capacitors, diodes, inductors, amplifiers, oscillators, switches, multiplexers, logic gates (e.g., AND, OR, XOR), power supplies, memories, or the like, such as can be configured in an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" or "circuit" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry", "processing circuitry", or "processor" as used herein thus refers to, is part of, or includes circuitry capable of sequentially and automatically carrying out a sequence of arithmetic or logical operations, or recording, storing, and/or transferring digital data. These terms may refer to one or more application processors, one or more baseband processors, a physical central processing unit (CPU), a single- or multi-core processor, and/or any other device capable of executing or otherwise operating computer-executable instructions, such as program code, software modules, and/or functional processes.

ADDITIONAL NOTES AND EXAMPLES

Example 1 includes a memory control circuit comprising a replica bit line (RBL) including a plurality of replica bit cells (RBCs) electrically coupled in series, a timer and control logic circuit situated to receive an output of the RBL, and a first multiplexer electrically coupled between the RBL and the timer and control logic circuit, the first multiplexer configured to set a replica word line (RWL) that controls, based on a state of select lines input into the first multiplexer and input provided by the timer and control logic, which of the RBCs is active.

In Example 2, Example 1 further includes, wherein the state of the select lines is set based on a state of one or more fuse registers.

In Example 3, at least one of Examples 1-2 further includes, wherein the first multiplexer includes, for each select bit of the first multiplexer, a transmission gate configured to receive a select control bit and a bit of the RWL and provide an output RWL select bit based on the select control bit and the bit of the RWL.

In Example 4, Example 3 further includes, wherein the transmission gate provides the RWL as output if the select bit is asserted and output logic zero otherwise.

In Example 5, at least one of Examples 1~4 further includes a second multiplexer situated to receive a bit of the RWL, a logic 0, and a second select line different from the select lines as input and provide either the bit of the RWL or the logic 0 as output based on a state of the second select line.

In Example 6, Example 5 further includes, wherein the second multiplexer de-asserts the output if the timer and control logic circuit asserts a write operation line.

In Example 7, Example 6 further includes a logic gate component situated to receive the write operation line and output of a fuse register and output the second select line based on a state of the write operation line and the output of the fuse register.

In Example 8, Example 7 further includes, wherein the logic gate is a NOR gate.

In Example 9, at least one of Examples 6-8 further includes, wherein the second multiplexer is a 2:1 multiplexer.

In Example 10, at least one of Examples 6-9 further includes a configurable inverter delay chain electrically coupled between the output of the RBL and the time and control logic circuit.

Example 11 includes a memory control circuit comprising a first replica bit line (RBL) including a first plurality of replica bit cells (RBCs) electrically coupled in series, a second RBL including a second plurality of RBCs electrically coupled in series, and a timing and control logic circuit situated to receive an output of the first and second RBLs.

In Example 12, Example 11 further includes, wherein output of the first RBL is shorted to the output of the second RBL.

In Example 13, at least one of Examples 11-12 further includes, wherein the timing and control logic circuit is configured to provide a same replica word line (RWL) to both the first and second RBLs.

In Example 14, Example 13 further includes, wherein the first and second RBLs include a same number of RBCs.

Example 15 includes a memory circuit comprising a memory comprising a plurality of bit cells (BCs), a replica bit line (RBL) including a plurality of replica bit cells (RBCs) electrically coupled in series, a sense amplifier configured to sense a differential voltage across one of the BCs, a timer and control logic circuit situated to receive an output of the RBL and control a state of the sense amplifier based on a state of the output of the RBL, and a first multiplexer electrically coupled between the RBL and the timer and control logic circuit, the first multiplexer configured to set a replica word line (RWL) that controls, based on a state of select lines input into the first multiplexer and input provided by the timer and control logic, which of the RBCs is active.

In Example 16, Example 15 further includes, wherein the state of the select lines is set based on a state of one or more fuse registers.

In Example 17, at least one of Examples 15-16 further includes, wherein the first multiplexer includes, for each select bit of the first multiplexer, a component configured to receive a select control bit and a bit of the RWL and provide an output RWL based on the select control bit and the bit of the RWL.

In Example 18, Example 17 further includes, wherein the component provides the bit of the RWL as output if the select control bit is asserted and output logic otherwise.

In Example 19, at least one of Examples 15-18 further includes a second multiplexer situated to receive a bit of the RWL, a logic 0, and a second select line different from the select lines as input and provide either the bit of the RWL or the logic 0 as output based on a state of the second select line.

In Example 20, Example 19 further includes, wherein the second multiplexer de-asserts the output if the timer and control logic circuit asserts a write operation line.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory control circuit comprising:
a replica bit line (RBL) including a plurality of replica bit cells (RBCs) electrically coupled in series;
a timer and control logic circuit situated to receive an output of the RBL; and
a first multiplexer electrically coupled between the RBL and the timer and control logic circuit, the first multiplexer configured to set a replica word line (RWL) that controls, based on a state of select lines input into the first multiplexer and input provided by the timer and control logic, which of the RBCs is active.

2. The memory control circuit of claim 1, wherein the state of the select lines is set based on a state of one or more fuse registers.

3. The memory control circuit of claim 1, wherein the first multiplexer includes, for each select bit of the first multiplexer, a transmission gate configured to receive a select control bit and a bit of the RWL, and provide an output RWL select bit based on the select control bit and the bit of the RWL.

4. The memory control circuit of claim 3, wherein the transmission gate provides the RWL as output if the select bit is asserted and output logic zero otherwise.

5. The memory control circuit of claim 1, further comprising a second multiplexer situated to receive a bit of the RWL, a logic 0, and a second select line different from the select lines as input, and provide either the bit of the RWL or the logic 0 as output based on a state of the second select line.

6. The memory control circuit of claim 5, wherein the second multiplexer de-asserts the output if the timer and control logic circuit asserts a write operation line.

7. The memory control circuit of claim 6, further comprising a logic gate component situated to receive the write operation line and output of a fuse register and output the second select line based on a state of the write operation line and the output of the fuse register.

8. The memory control circuit of claim 7, wherein the logic gate is a NOR gate.

9. The memory control circuit of claim 6, wherein the second multiplexer is a 2:1 multiplexer.

10. The memory control circuit of claim 1, further comprising a configurable inverter delay chain electrically coupled between the output of the RBL and the time and control logic circuit.

11. A memory control circuit comprising:
a first replica bit line (RBL) including a first plurality of replica bit cells (RBCs) electrically coupled in series;
a second RBL including a second plurality of RBCs electrically coupled in series; and
a timing and control logic circuit situated to receive an output of the first and second RBLs, wherein output of the first RBL is shorted to the output of the second RBL.

12. The memory control circuit of claim 11, wherein the timing and control logic circuit is configured to provide a same replica word line (RWL) to both the first and second RBLS.

13. The memory control circuit of claim 12, wherein the first and second RBLs include a same number of RBCs.

14. A memory circuit comprising:
a memory comprising a plurality of bit cells (BCs);
a replica bit line (RBL) including a plurality of replica bit cells (RBCs) electrically coupled in series;
a sense amplifier configured to sense a differential voltage across one of the BCs;
a timer and control logic circuit situated to receive an output of the RBL and control a state of the sense amplifier based on a state of the output of the RBL; and
a first multiplexer electrically coupled between the RBL and the timer and control logic circuit, the first multiplexer configured to set a replica word line (RWL) that controls, based on a state of select lines input into the first multiplexer and input provided by the timer and control logic, which of the RBCs is active.

15. The memory circuit of claim 14, wherein the state of the select lines is set based on a state of one or more fuse registers.

16. The memory circuit of claim 14, wherein the first multiplexer includes, for each select bit of the first multiplexer, a component configured to receive a select control bit and a bit of the RWL, and provide an output RWL based on the select control bit and the bit of the RWL.

17. The memory circuit of claim 16, wherein the component provides the bit of the RWL as output if the select control bit is asserted and output logic otherwise.

18. The memory circuit of claim 14, further comprising a second multiplexer situated to receive a bit of the RWL, a logic 0, and a second select line different from the select lines as input, and provide either the bit of the RWL or the logic 0 as output based on a state of the second select line.

19. The memory circuit of claim 18, wherein the second multiplexer de-asserts the output if the timer and control logic circuit asserts a write operation line.

* * * * *